US008264293B2

(12) United States Patent
Yun et al.

(10) Patent No.: US 8,264,293 B2
(45) Date of Patent: Sep. 11, 2012

(54) OSCILLATOR

(75) Inventors: Seok Ju Yun, Daejeon (KR); Hui Dong Lee, Daejeon (KR); Kwi Dong Kim, Daejeon (KR); Jong Kee Kwon, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 73 days.

(21) Appl. No.: 12/844,686

(22) Filed: Jul. 27, 2010

(65) Prior Publication Data

US 2011/0018644 A1  Jan. 27, 2011

(30) Foreign Application Priority Data

Jul. 27, 2009 (KR) .................. 10-2009-0068386
Mar. 11, 2010 (KR) .................. 10-2010-0021678

(51) Int. Cl.
*H03B 5/08* (2006.01)
(52) U.S. Cl. .............. 331/167; 331/117 R; 331/117 FE; 331/179; 331/177 V
(58) Field of Classification Search ............ 331/116 FE, 331/116 R, 167, 177 V, 179 V
See application file for complete search history.

(56) References Cited

U.S. PATENT DOCUMENTS

| 7,423,495 B2 * | 9/2008 | Bevilacqua et al. .... 331/117 FE |
| 8,018,293 B2 * | 9/2011 | Rangarajan et al. .... 331/117 FE |
| 2006/0181355 A1 | 8/2006 | Copani et al. |
| 2006/0181362 A1 | 8/2006 | Ikuta et al. |
| 2008/0042768 A1 | 2/2008 | Luong et al. |

FOREIGN PATENT DOCUMENTS

| EP | 1 852 968 A1 | 11/2007 |
| JP | 2008-042275 | 2/2008 |
| KR | 1020050034344 A | 4/2005 |

OTHER PUBLICATIONS

Zahra Safarian et al., "A 1.3-6 GHz Triple-Mode CMOS VCO Using Coupled Inductors", IEEE 2008 Custom Integrated Circuits Conference (CICC), 2008, pp. 69-72, IEEE.
Andrea Bevilacqua et al., "Transformer-Based Dual-Mode Voltage-Controlled Oscillators", IEEE Transactions on Circuits and Systems-II: Express Briefs, Apr. 2007, pp. 293-297, vol. 54, No. 4, IEEE.

* cited by examiner

*Primary Examiner* — Arnold Kinkead

(57) ABSTRACT

Provided is a transformer-based oscillator which is suited to oscillate frequencies in multiple bands. An oscillator includes a transformer resonance unit and a plurality of complementary transistors. The transformer resonance unit includes a primary coil and a secondary coil corresponding to the primary coil. The plurality of complementary transistors have gates and drains between which both ends of the transformer resonance unit are respectively connected. Thus, the oscillator may operate in a differential mode or common mode according to the phase of the transformer resonance unit. Also, a complementary transistor constituting a multiband oscillation loop may be independently connected to both ends of the transformer resonance unit, and an oscillation loop of at least one band may be selected out of a multiband oscillation loop using a switch unit. Thus, the oscillator may be suited to oscillate resonance frequencies in multiple bands.

14 Claims, 7 Drawing Sheets

OSCILLATOR

CROSS-REFERENCE TO RELATED APPLICATION

This application claims priority to and the benefit of Korean Patent Application Nos. 10-2009-0068386 filed Jul. 27, 2009 and 10-2010-0021678 filed Mar. 11, 2010, the disclosure of which is incorporated herein by reference in its entirety.

BACKGROUND

1. Field of the Invention

The present invention relates to a transformer-based oscillator, and more specifically, to a transformer-based oscillator suited to oscillate frequencies in multiple bands.

2. Discussion of Related Art

A voltage control oscillator (VCO) is kind of an oscillator and control a voltage to vary the capacitance of a variable capacitor (or varactor) so as to control a frequency. The VCO may be widely employed for wired/wireless communications transceivers.

In recent years, with technical developments of tuners, SDRs, and multiband receivers, a vast amount of research has been conducted on wide-band VCOs configured to improve phase-noise performance.

Although LC-tank VCOs have mainly been used conventionally, the LC-tank VCOs may have low noise performances, and the number of capacitors or varactors constituting tanks cannot be increased within wide ranges in fixed frequency ranges. In other words, the conventional LC-tank VCOs may be inappropriate for the output of broadband frequencies.

To solve the above-described problem, a technique using a switch-controlled inductor and a technique using a switch capacitor array have been proposed.

The technique using a switch-controlled inductor may include connecting a switch to an inductor to control the entire inductance using a switch so that a resonance-frequency output range of a VCO can be increased. Also, the technique using a switch capacitor array may include outputting a wide-band frequency using a fixed capacitance varied by a varactor and a plurality of binary controllers.

However, in the technique using the switch-controller inductor, an inductance may be controlled using a switch, and thus the characteristics of the inductor can be degraded, deteriorating the performance of the VCO. Also, in the switch capacitor array technique, since a switch-controlled capacitor may include a control device having a parasitic component and the Q-factor of a resonance unit may be reduced due to a channel resistance of a switch transistor, the switch capacitor array may have degraded phase noise characteristics.

SUMMARY OF THE INVENTION

The present invention is directed to an oscillator, which may include a complementary active region connected independently to both ends of a resonance unit and may be suited to oscillate frequencies in multiple bands.

One aspect of the present invention provides an oscillator including: a transformer resonance unit including a primary coil and a secondary coil corresponding to the primary coil; and a plurality of complementary transistors having gates and drains between which both ends of the transformer resonance unit are respectively connected.

BRIEF DESCRIPTION OF THE DRAWINGS

The above and other features and advantages of the present invention will become more apparent to those of ordinary skill in the art by describing in detail exemplary embodiments thereof with reference to the attached drawings in which.

DETAILED DESCRIPTION OF EXEMPLARY EMBODIMENTS

The present invention will now be described more fully hereinafter with reference to the accompanying drawings, in which exemplary embodiments of the invention are shown. Descriptions of well-known components and processing techniques are omitted so as not to unnecessarily obscure the embodiments of the present invention. Like numbers refer to like elements throughout.

Figure 1:
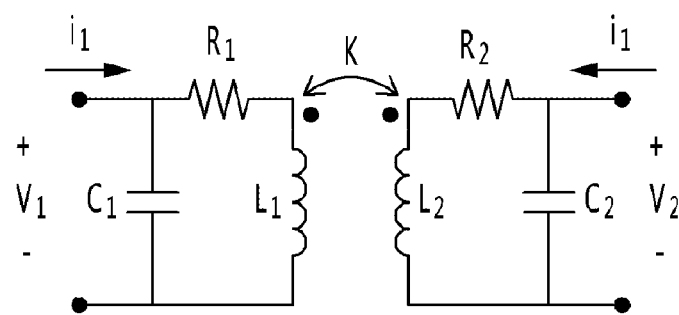
FIG. 1 is a circuit construction diagram of a transformer-based resonance unit according to an exemplary embodiment of the present invention.

FIG. 1 is a circuit construction diagram of a transformer-based resonance unit according to an exemplary embodiment of the present invention.

Referring to FIG. 1, the transformer-based resonance unit may include first and second ports, the first port may include an inductor L1, a capacitor C1, and a parasitic resistor R1, and the second port may include an inductor L2, a capacitor C2, and a parasitic resistor R2.

Here, the two inductors L1 and L2 that determine the resonance frequency of a resonance unit may be coupled by a coupling constant k to generate a mutual inductance M. When the inductor L1 and the capacitor C1 of the first port have the same values as the inductor L2 and the capacitor C2 of the second port, the resonance unit may have two different mode phases in two stable states.

Here, an oscillation frequency generated in each phase mode may be obtained as shown in Equation 1:

$$\omega_H^2 = \frac{1}{(L-M)C}, \quad \omega_L^2 = \frac{1}{(L+M)C}, \tag{1}$$

where $\omega_H$ denotes the oscillation frequency generated in the odd mode, and $\omega_L$ denotes the oscillation frequency generated in the even mode. Thus, the inductance of the inductor may be varied by as much as the mutual inductance M in the two phase modes, and the oscillation frequency may be in different bands in the two phase modes.

That is, a transformer-based resonance unit may generate a relatively high-frequency resonance frequency in an odd mode and generate a relatively low-frequency resonance frequency in an even mode. By use of the above-described transformer-based resonance unit with two phase modes, an active element connected to the transformer-based resonance unit may have two different types of feedback loops.

Figure 2A:
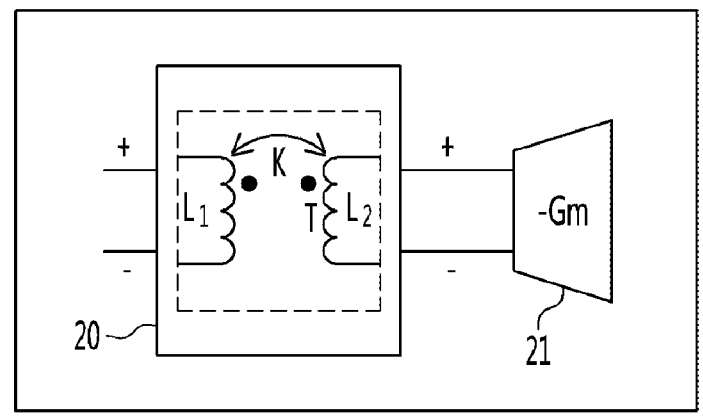
FIGS. 2A through 2C are construction diagrams of oscillators using transformer-based resonance units according to exemplary embodiments of the present invention.
Figure 2B:
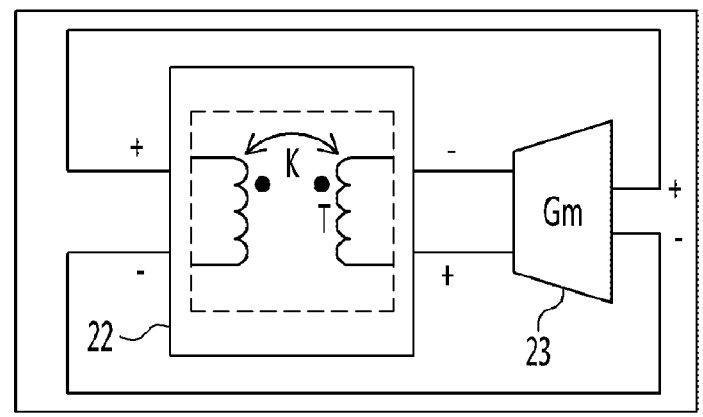
Figure 2C:
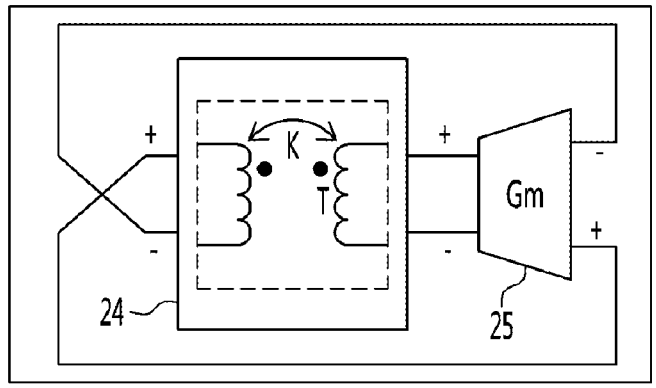

FIGS. 2A through 2C are construction diagrams of an oscillator using a transformer-based resonance unit according to exemplary embodiments of the present invention. For brevity, some components are omitted or illustrated with blocks.

FIG. 2A is a construction diagram of a voltage-controlled oscillator (VCO) using a negative resistor. Referring to FIG. 2A, the VCO may include a transformer-based resonance unit 20 to which a negative resistance is applied and an active element 21.

FIG. 2B is a construction diagram of a VCO, which may operate in an odd mode and generate a resonance frequency in a high-frequency band. Referring to FIG. 2B, the VCO may include a transformer-based resonance unit 22 and an active element 23.

In the above-described VCO, 180° phase delay of the active element 23 and odd-mode phase delay 180° of a transformer may be combined to form a positive feedback loop.

FIG. 2C is a construction diagram of a VCO, which may operate in an even mode and generate a resonance frequency in a low-frequency band. Referring to FIG. 2C, the VCO may include a transformer-based resonance unit 24 and an active element 25.

In the above-described VCO, 180° phase delay of the active element 25 and 180° obtained by cross-connection of a differential end of a transformer may be combined to form a positive feedback loop.

Figure 3A:
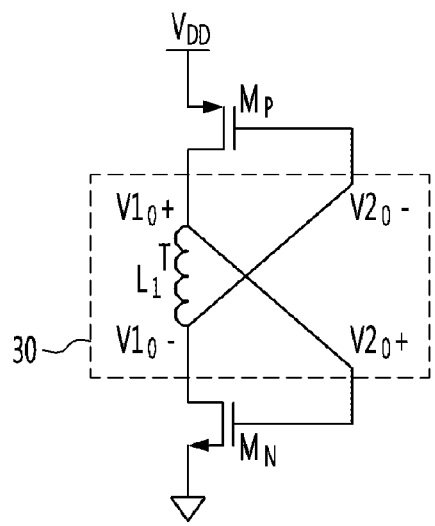
FIGS. 3A through 3C are construction diagrams of complementary oscillators according to exemplary embodiments of the present invention.
Figure 3B:
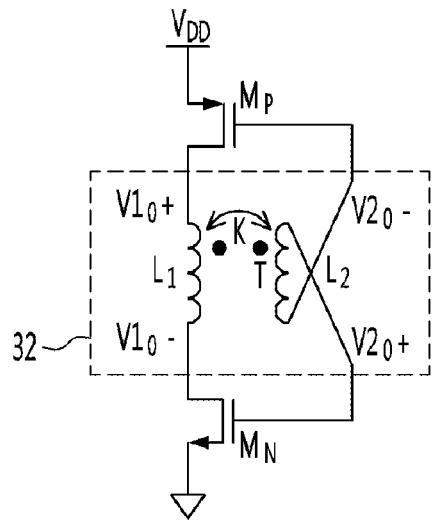
Figure 3C:
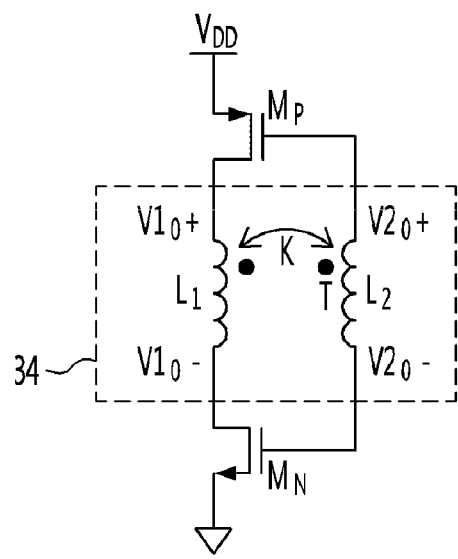

FIGS. 3A through 3C are construction diagrams of complementary oscillators according to exemplary embodiments of the present invention, which have respectively different negative resistance generators and LC resonance units. For brevity, some components are omitted or illustrated with blocks.

FIG. 3A is a construction diagram of a complementary VCO having an N-PMOS cross-connected structure.

Referring to FIG. 3A, the complementary VCO may include a resonance unit 30 and complementary transistors $M_P$ and $M_N$. A single inductor L1 may be connected to a positive feedback loop including a combination of an NMOS transistor $M_N$ and a PMOS transistor $M_P$. The complementary VCO having the above-described construction may oscillate in a relatively low-frequency band.

FIG. 3B is a construction diagram of a complementary VCO having a gate inversely-coupling structure.

Referring to FIG. 3B, the complementary VCO may include a resonance unit 32 and complementary transistors $M_P$ and $M_N$. In this case, drains and gates of NMOS and PMOS transistors $M_N$ and $M_P$ may be connected to the first and second ports of the resonance unit 32 to constitute a positive feedback loop. In particular, the phases of voltages may be inverted and applied to the gates of the NMOS and PMOS transistors $M_N$ and $M_P$. The complementary VCO having the above-described construction may oscillate in a low-frequency band.

FIG. 3C is a construction diagram of a complementary VCO having a gate coupling structure.

Referring to FIG. 3C, the complementary VCO may include a resonance unit 34 and complementary transistors $M_P$ and $M_N$. In this case, drains and gates of NMOS and PMOS transistors $M_N$ and $M_P$ may be connected to first and second ports of the resonance unit 34 to constitute a positive feedback loop. In particular, the phases of voltages applied to the gates of the NMOS and PMOS transistors $M_N$ and $M_P$ may not be inverted but directly applied. The complementary VCO having the above-described construction may oscillate in a high-frequency band.

Figure 4A:
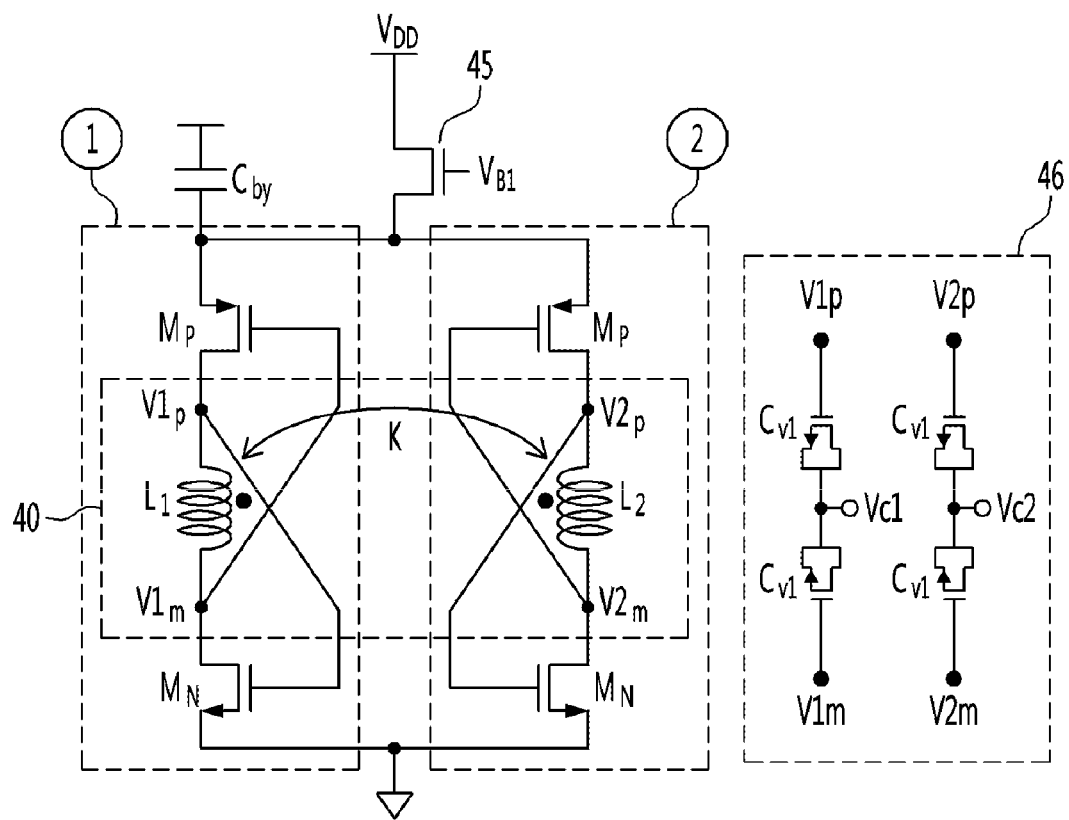
FIGS. 4A through 4C are construction diagrams of oscillators according to exemplary embodiments of the present invention.
Figure 4B:
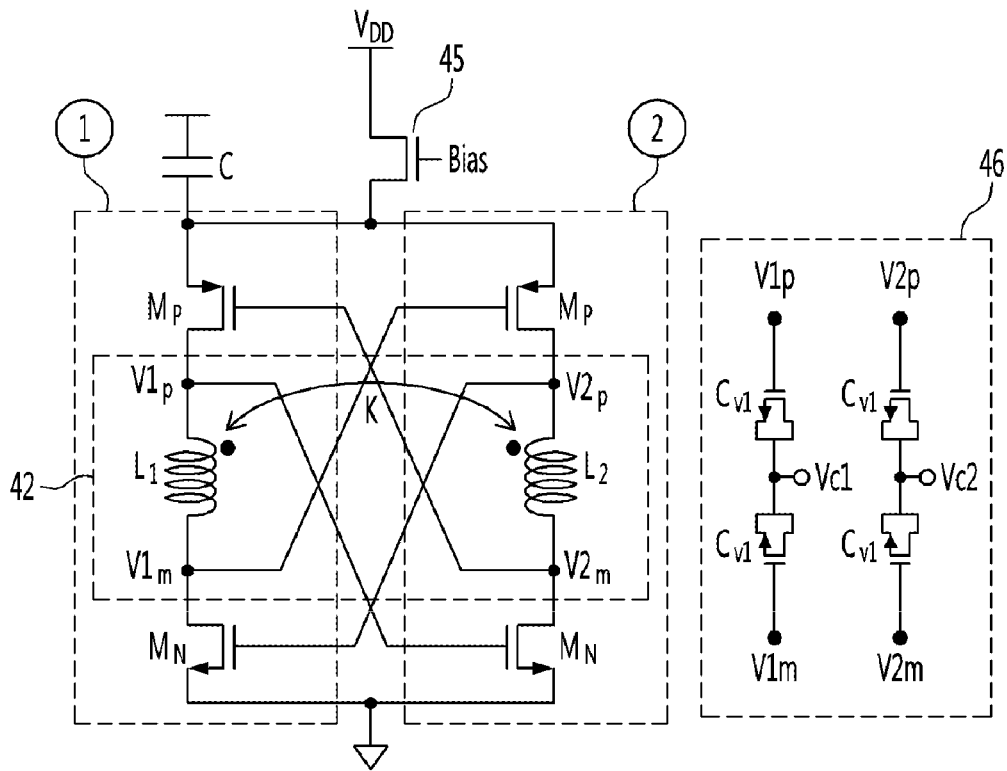
Figure 4C:
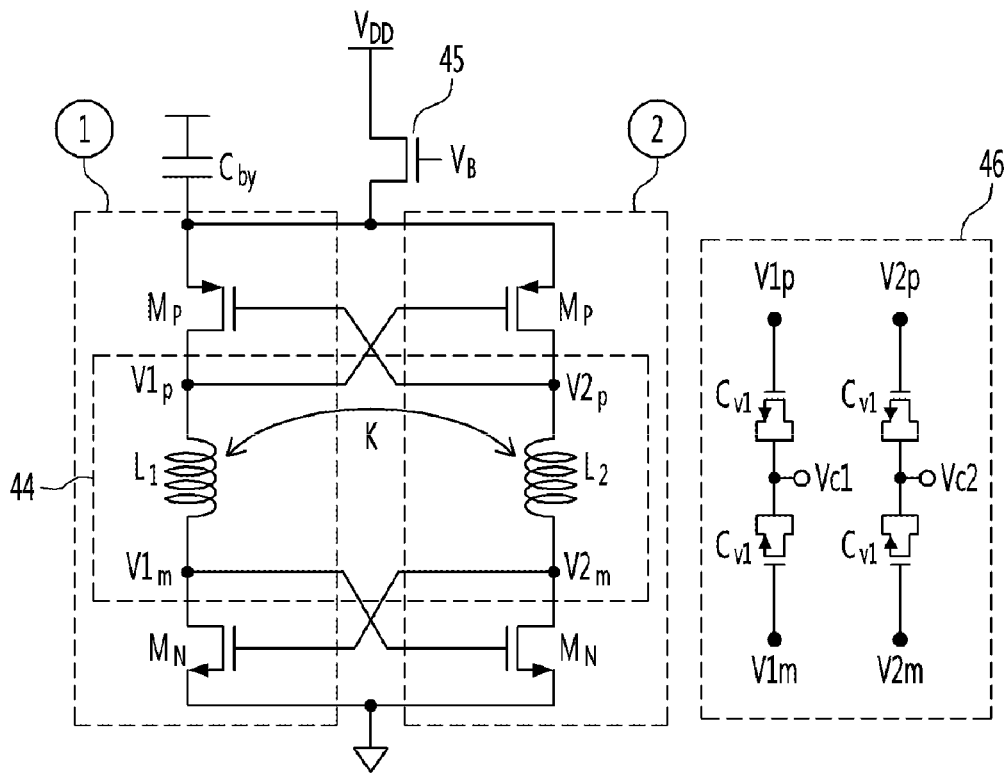

FIGS. 4A through 4C are construction diagrams of oscillators according to exemplary embodiments of the present invention, in which an active element is independently connected to both ends of a transformer-based resonance unit. For brevity, some components are omitted.

Referring to FIGS. 4A through 4C, the VCOs according to the exemplary embodiments may include transformer-based resonance units 40, 42, and 44, respectively, and further include a complementary active element $M_P$ and $M_N$. Each of the transformer-based resonance units 40, 42, and 44 may include a primary coil L1 and a secondary coil L2 corresponding to the primary coil L1. The complementary active element $M_P$ and $M_N$ may be independently connected to both ends of each of the resonance units 40, 42, and 44. Also, each of the VCOs according to the exemplary embodiments may further include a current source 45 configured to supply current to the complementary active element $M_P$ and $M_N$, a varactor 46 configured to vary the frequency output of the VCO, and a capacitor $C_{by}$ configured to filter a noise during operation of the VCO and increase the gain of the complementary active element $M_P$ and $M_N$.

In particular, the present embodiments will be described on the assumption that the complementary active element $M_P$ and $M_N$ is independently connected to both ends of each of the resonance units 40, 42, and 44 such that the complementary active element $M_P$ and $M_N$ connected to a primary end ① of each of the resonance units 40, 42, and 44 has the same structure as the complementary active element $M_P$ and $M_N$ connected to a secondary end ② thereof.

FIG. 4A is a construction diagram of a VCO in which a complementary active element $M_P$ and $M_N$ is connected in an N-PMOS cross-connected structure to both ends of a transformer-based resonance unit 40.

FIG. 4B is a construction diagram of a VCO in which a complementary active element $M_P$ and $M_N$ is connected in a gate inversely-coupling structure to both ends of a transformer-based resonance unit 42. A primary coil L1 may be connected to drains of the NMOS and PMOS transistors $M_N$ and $M_P$, and a secondary coil L2 may be inversely connected to gates of the NMOS and PMOS transistors $M_N$ and $M_P$. That is, the resonance unit 42 may enter an even mode in which the voltage phase of a primary end ① is equal to that of a secondary end ②.

FIG. 4C is a construction diagram of a VCO in which a complementary active element $M_P$ and $M_N$ is connected in a gate coupling structure to both ends of a transformer-based resonance unit 44.

In this case, the complementary active element $M_P$ and $M_N$ may include an NMOS transistor $M_N$ and a PMOS transistor $M_P$. A primary coil L1 may be connected to drains of the PMOS and NMOS transistors $M_P$ and $M_N$, and a secondary coil L2 may be connected in the same phase to gates of the transistors $M_P$ and $M_N$. That is, the resonance unit 42 may enter an odd mode in which a voltage of the primary end ① is inverted in phase to that of the secondary end ②.

Figure 5A:
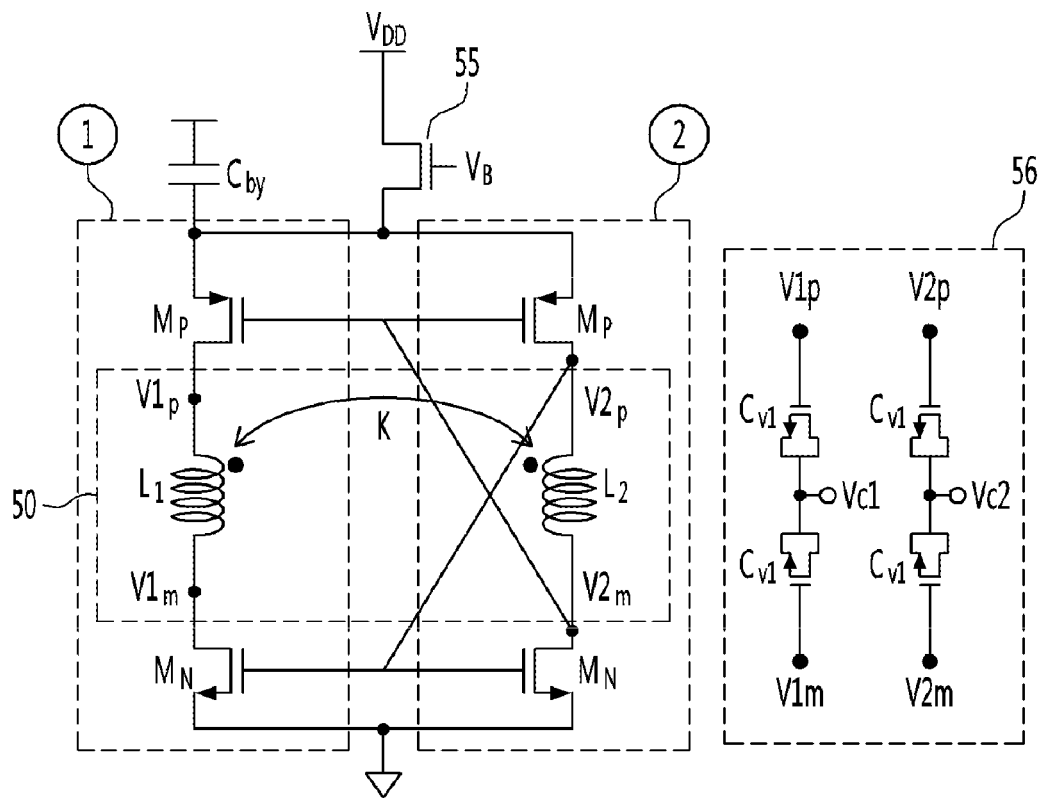
FIGS. 5A through 5B are construction diagrams of oscillators according to exemplary embodiments of the present invention.
Figure 5B:
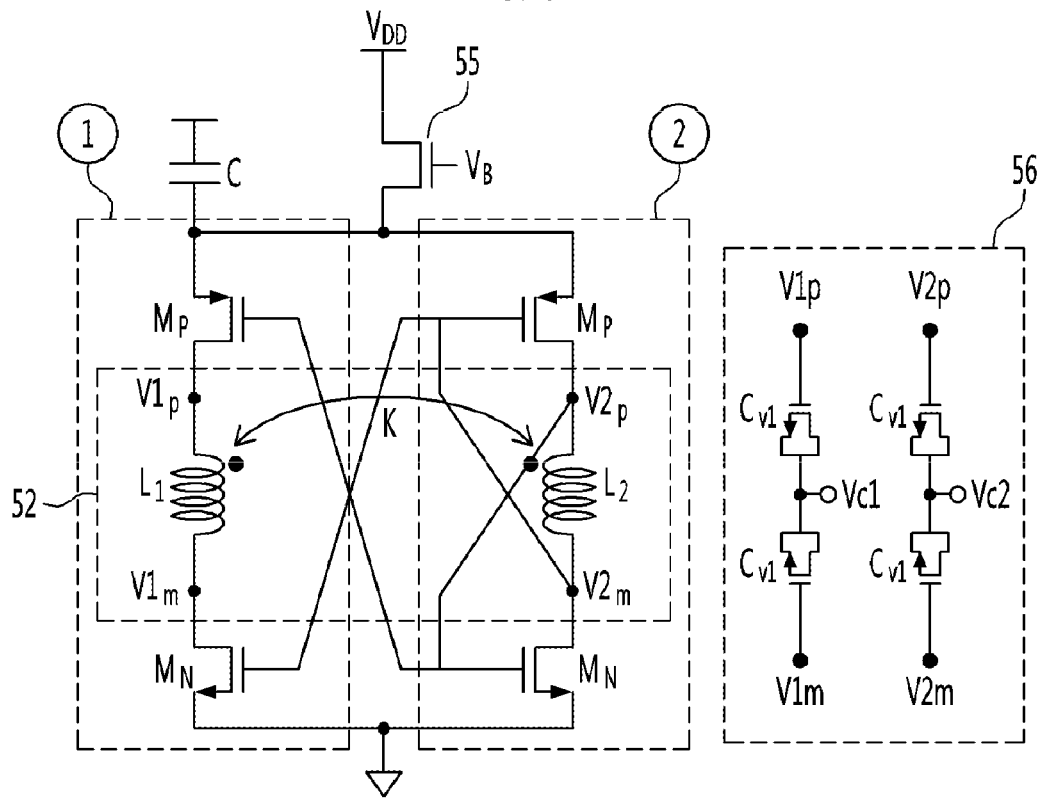

FIGS. 5A and 5B are construction diagrams of oscillators according to exemplary embodiments of the present invention, in which an active element is independently connected to both ends of a transformer-based resonance unit. For brevity, some components are omitted.

Referring to FIGS. 5A and 5B VCOs according to exemplary embodiments of the present invention may include transformer-based resonance units 50 and 52 and a complementary active element $M_P$ and $M_N$. Each of the transformer-based resonance units 50 and 52 may include a primary coil L1 and a secondary coil L2 corresponding to the primary coil L1. The complementary active element $M_P$ and $M_N$ may be independently connected to both ends of each of the resonance units 50 and 52. Also, each of the VCOs may further include a current source 55 configured to supply current to the complementary active element $M_P$ and $M_N$, a varactor 56 configured to vary the frequency output of the VCO, and a capacitor $C_{by}$ configured to filter a noise during operation of the VCO and increase the gain of the complementary active element $M_P$ and $M_N$.

In particular, the present embodiments will be described on the assumption that the complementary active element $M_P$ and $M_N$ is independently connected to both ends of each of the resonance units 50 and 52 such that the complementary active element $M_P$ and $M_N$ connected to a primary end ① it has a different structure from the complementary active element $M_P$ and $M_N$ connected to a secondary end ② thereof.

Referring to FIG. 5A, the complementary active element $M_P$ and $M_N$ may be connected in a gate inversely-coupling structure to the primary end ① of the transformer-based resonance unit 50 and connected in an N-PMOS cross-connected structure to a secondary end ② thereof. Of course, structures of the primary and secondary ends ① and ② may be changed.

In the above-described structure, the VCO may operate in an even mode in which the voltage of the primary end ① of the transformer-based resonance unit 50 is equal in phase to that of the secondary end ②.

Referring to FIG. 5B, the complementary active element $M_P$ and $M_N$ may be connected in a gate coupling structure to the primary end ① of the transformer-based resonance unit 52 and connected in an N-PMOS cross-connected structure to the secondary end ② thereof. Of course, structures of the primary and secondary ends ① and ② may be changed.

In the above-described structure, the VCO may operate in an odd mode in which the voltage of the primary end ① of the transformer-based resonance unit 50 is different in phase from that of the secondary end ②.

According to the above-described embodiment of the present invention, a complementary active element may be independently connected to both ends of a transformer-based resonance unit so that a VCO may operate in a differential mode or common mode according to the phase of the transformer-based resonance unit.

Figure 6:
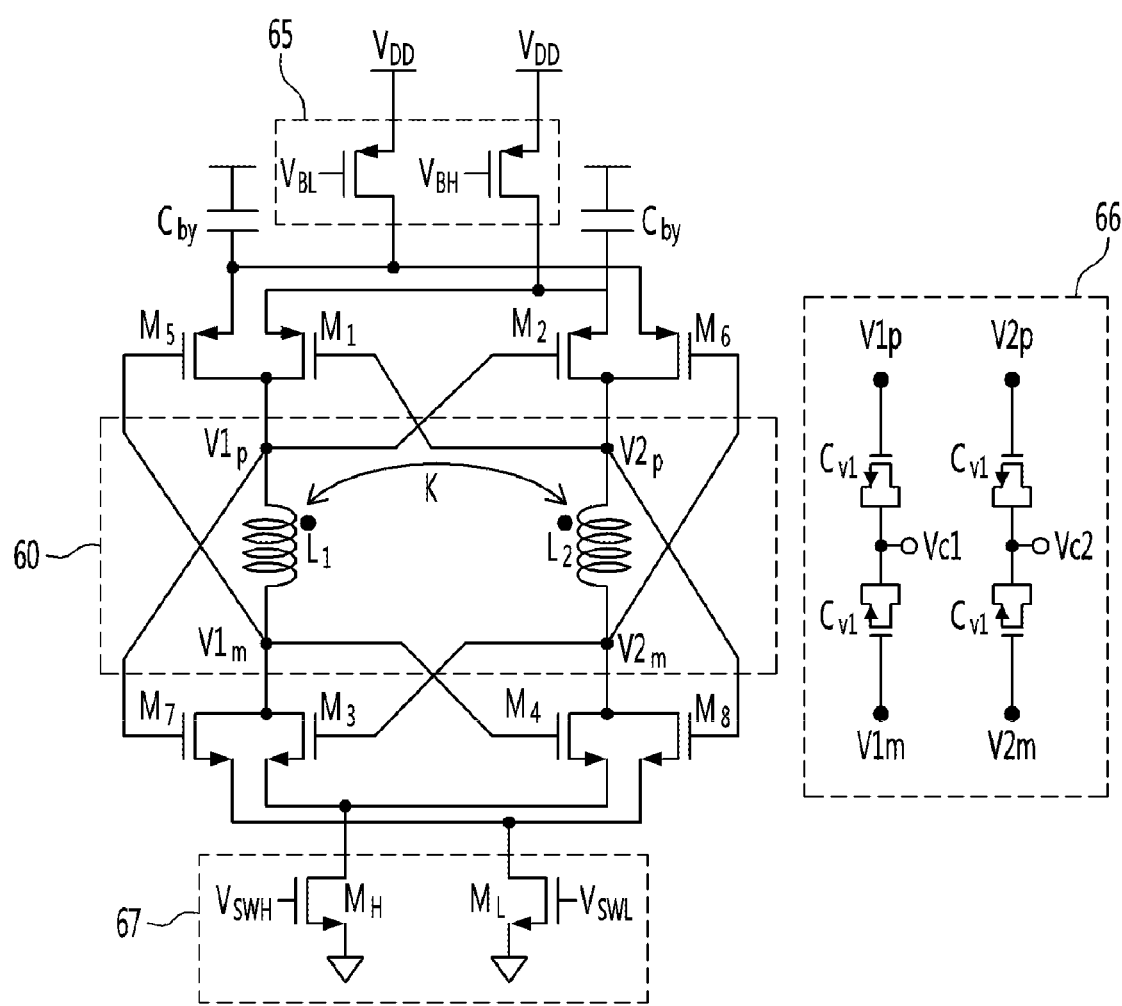
FIGS. 6 and 7 are construction diagrams of multiband oscillators according to exemplary embodiments of the present invention.
Figure 7:
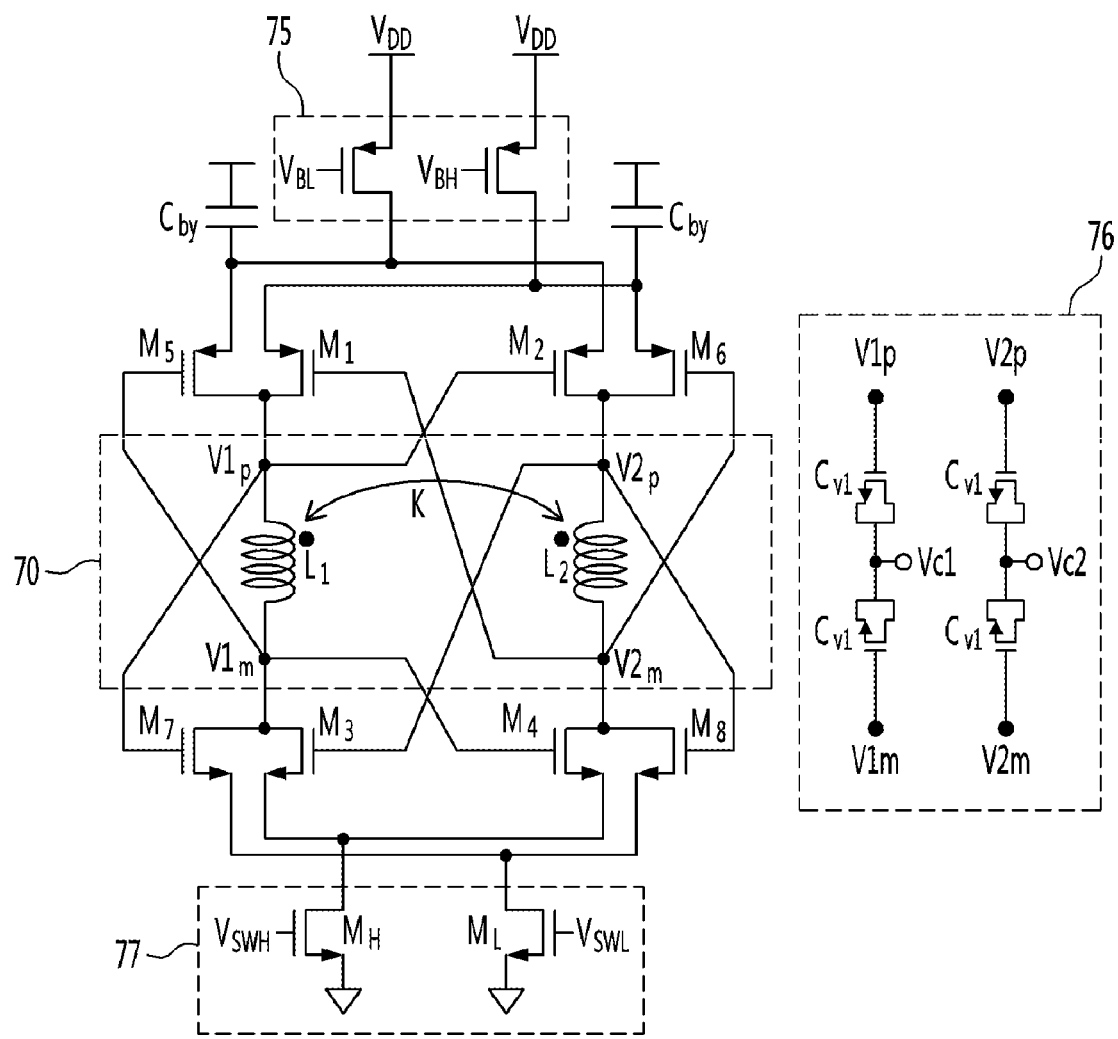

FIGS. 6 and 7 are construction diagrams of multiband oscillators according to exemplary embodiments of the present invention. In particular, FIGS. 6 and 7 illustrate constructions of double-band VCOs.

Each of the multiband VCOs according to the exemplary embodiments of the present invention may include a transformer-based resonance unit 60 or 70, a complementary active element $M_1$ to $M_8$, and a switch 67 or 77. Each of the transformer-based resonance units 60 and 70 may include a primary coil L1 and a secondary coil L2 corresponding to the primary coil L1. The complementary active element $M_1$ to $M_8$ may be independently coupled to both ends of each of the resonance units 60 and 70 to constitute a multiband oscillation loop. Each of the switch units 67 and 77 may be configured to select an oscillation loop of at least one band out of multiband oscillation loops. Also, each of the multiband VCOs may further include a current source 65 or 75 configured to supply current to the complementary active element $M_1$ to $M_8$, a varactor 66 or 76 configured to vary the frequency output of the VCO, and a capacitor $C_{by}$ configured to filter a noise during operation of the VCO and increase the gain of the complementary active element $M_1$ to $M_8$.

In the above-described structure, the complementary active element $M_1$ to $M_8$ may be independently connected to both ends of the resonance unit 60 or 70 such that the complementary active element $M_1$ to $M_8$ forms a multiband oscillation loop. Thus, an oscillation loop of a desired band may be selected out of the multiband oscillation loop using the switch unit 67 or 77, thereby enabling the output of multiband frequency. Also, since the multiband VCO may be embodied using one resonance unit 60, power consumption may be reduced, and the fabrication of the multiband VCO may also be reduced.

FIG. 6 is a construction diagram of an example of a multiband VCO according to an exemplary embodiment of the present invention. Referring to FIG. 6, a double-band VCO may include complementary active elements $M_1$ to $M_6$, which form a high-frequency oscillation loop and a low-frequency oscillation loop.

Referring to FIG. 6, a double-band VCO may be prepared by combining first and second oscillators. The first oscillator may be prepared to connect a complementary active element having transistors $M_5$ to $M_8$ as an N-PMOS cross-connected structure to both ends of a transformer-based resonance unit 60, and the second oscillator may be prepared to connect a complementary active element having transistors $M_1$ to $M_4$ in a gate coupling structure to both ends of the transformer-based resonance unit 60.

In this case, the transistors $M_5$ to $M_8$ of the complementary active element connected in the N-PMOS cross-connected structure may constitute a low-frequency oscillation loop and operate in an even mode, and the transistors $M_1$ to $M_4$ of the complementary active element connected in the gate coupling structure may constitute a high-frequency oscillation loop and operate in an odd mode. Thus, the VCO may operate in the even mode and odd mode so that the VCO may have a double frequency band.

In this case, one of the two oscillation modes may be selected by selecting a high-frequency oscillation mode or a low-frequency oscillation mode using the switch unit 67. For example, the high-frequency oscillation loop may be selected by enabling a switch MH, while the low-frequency oscillation loop may be selected by enabling a switch ML.

FIG. 7 is a construction diagram of an example of a multiband VCO according to an exemplary embodiment of the present invention. Referring to FIG. 7, a double-band VCO may include complementary active elements $M_1$ to $M_8$, which may form a high-frequency oscillation loop and a low-frequency oscillation loop.

Referring to FIG. 7, a double-band VCO may be formed by combining first and second complementary active elements. The first complementary active element including transistors $M_5$ to $M_8$ may be connected in a gate inversely-coupling structure to a primary end of the transformer-based resonance unit 70 and connected in an N-PMOS cross-connected structure to a secondary end thereof. The second complementary active element including transistors $M_5$ to $M_8$ may be connected in a gate coupling structure to a primary end of the transformer-based resonance unit 70 and connected in an N-PMOS cross-connected structure to a secondary end thereof.

In this case, the complementary active element including the transistors $M_5$ to $M_8$, which is connected in the gate inversely-coupling structure to the primary end of the transformer-based resonance unit 70 and connected in the N-PMOS cross-connected structure to the secondary end thereof, may constitute a low-frequency oscillation loop and operate in an even mode. Also, the complementary active element including the transistors $M_1$ to $M_4$, which is connected in the gate coupling structure to the primary end of the transformer-based resonance unit 70 and connected in the N-PMOS cross-connected structure to the secondary end thereof, may constitute a high-frequency oscillation loop and operate in an odd mode. Thus, the VCO may operate in the even mode and odd mode so that the VCO may have a double frequency band.

In this case, one of the two oscillation modes may be selected by selecting a high-frequency oscillation mode or a low-frequency oscillation mode using the switch unit 77. For example, the high-frequency oscillation loop may be selected by enabling a switch MH, while the low-frequency oscillation loop may be selected by enabling a switch ML.

Although the double-band VCO is described as an example of the multiband VCO, the present invention is not limited thereto. In addition, the complementary active element may be independently connected to both ends of the resonance unit using a combination of oscillators with various structures shown in FIGS. 4A through 5B, thereby embodying the multiband VCO.

According to the present invention, a complementary active element may be independently connected to both ends of a resonance unit so that a VCO can operate in a differential mode or common mode according to the phase of the resonance unit.

Also, a complementary active element constituting a multi-band oscillation loop may be independently connected to both ends of a resonance unit, and an oscillation loop of at least one band may be selected out of a multiband oscillation loop using a switch unit so that a VCO suited to oscillate resonance frequencies in multiple bands can be provided. In particular, a complementary active element may be independently connected to one resonance unit to form a high-frequency oscillation loop and a low-frequency oscillation loop. Thus, a high-frequency band and a low-frequency band may be simultaneously generated, and a chip size may be reduced. As a result, the multiband frequency performance of a system may be improved, power consumption may be reduced, and fabrication costs may be reduced.

Although exemplary embodiments of the present invention have been described with reference to the attached drawings, the present invention is not limited to these embodiments, and it should be appreciated to those skilled in the art that a variety of modifications and changes can be made without departing from the spirit and scope of the present invention.

What is claimed is:

1. An oscillator comprising:
a transformer resonance unit including a primary coil and a secondary coil corresponding to the primary coil; and
a plurality of complementary transistor pairs comprising a first part having at least one of the complementary transistor pairs and a second part having the remaining complementary transistor pairs,
wherein the primary coil is disposed between a drain of a PMOS transistor and a drain of an NMOS transistor in the first part, and the secondary coil is disposed between a drain of a PMOS transistor and a drain of an NMOS transistor in the second part, and
wherein each of the plurality of complementary transistor pairs is disposed between a power supply voltage terminal and a ground voltage terminal.

2. The oscillator of claim 1, wherein the oscillator operates in a differential mode or a common mode according to a type of a feedback loop of each of the complementary transistor pairs coupled to the primary coil and the secondary coil of the transformer resonance unit.

3. The oscillator of claim 1, wherein gates of the complementary transistor pairs in the first and second parts are coupled to the primary coil and the secondary coil, respectively, to form an N-PMOS intersection connection structure.

4. The oscillator of claim 1, wherein gates of the complementary transistor pairs in the first and second parts are coupled to the secondary coil and the primary coil, respectively, to form a gate inversely-coupling structure that is configured to have an inverted signal and form an oscillation feedback loop.

5. The oscillator of claim 1, wherein gates of the complementary transistor pairs in the first and second parts are coupled to the second coil and the primary coil, respectively, to form a gate equal-phase coupling structure that is configured to have an equal-phase signal and form an oscillation feedback loop.

6. The oscillator of claim 1, wherein gates of the complementary transistor pair in the second part are coupled to the secondary coil to form an N-PMOS intersection connection structure, and gates of the complementary transistor pair in the first part are coupled to the secondary coil to form a gate inversely-coupling structure.

7. The oscillator of claim 1, wherein gates of the complementary transistor pair in the second part are coupled to the secondary coil to form an N-PMOS intersection connection structure, and gates of the complementary transistor pair in the first part are coupled to the secondary coil to form a gate equal-phase coupling structure.

8. The oscillator of claim 1, wherein gates of the complementary transistor pairs in the first and second parts are coupled to the primary and secondary coils in the transformer resonance unit to form a combination of at least two selected from the group consisting of:
an N-PMOS intersection connection structure disposed at one end or both ends of the transformer resonance unit;
a gate inversely-coupling structure disposed at the one end or the both ends of the transformer resonance unit;
a gate coupling structure disposed at the one end or the both ends of the transformer resonance unit;
an N-PMOS intersection connection structure disposed at the one end of the transformer resonance unit and a gate inversely-coupling structure disposed at the other end thereof; and
an N-PMOS intersection connection structure disposed at a primary end of the transformer resonance unit and a gate coupling structure disposed at a secondary end of the transformer resonance unit.

9. The oscillator of claim 8, wherein the gates of the complementary transistor pairs in the first and second parts are coupled to the primary and secondary coils to form a combination of:
an N-PMOS intersection connection structure configured to form a feedback loop in which a voltage between the gates and drains of the complementary transistor pairs is applied as an equal-phase signal to the transformer resonance unit; and
a gate inversely-coupling structure configured to form a feedback loop in which the voltage between the gates and drains of the complementary transistor pairs is applied as an equal-phase signal to the transformer resonance unit.

10. The oscillator of claim 8, wherein the gates of the complementary transistor pairs in the first and second parts are coupled to the primary and secondary coils to form a combination of:
a first structure including a gate inversely-coupling structure disposed at the primary end of the transformer resonance unit and an N-PMOS intersection connection structure disposed at the secondary end of the transformer resonance unit to form a feedback loop in which voltages between the gates and drains of the complementary transistor pairs are applied as an equal-phase signal to the transformer resonance unit; and a second structure including a gate coupling structure disposed at the primary end of the transformer resonance unit and an N-PMOS intersection connection structure disposed at the secondary end of the transformer resonance unit to form a feedback loop in which the voltages between the gates and drains of the complementary transistor pairs are applied as an inverted signal to the transformer resonance unit.

11. The oscillator of claim 8, wherein at least two structures configured to operate in a single frequency band with different oscillation bands are combined to form a multiband oscillation loop.

12. The oscillator of claim 1, further comprising a switch unit configured to select an oscillation loop of at least one band out of the multiband oscillation loop.

13. The oscillator of claim 1, further comprising a current source configured to supply current to the complementary transistor pairs in the first and second parts.

14. The oscillator of claim 1, further comprising a variable capacitor configured to vary a frequency output of the oscillator.

* * * * *